(12) United States Patent
Iwai

(10) Patent No.: US 8,848,446 B2
(45) Date of Patent: Sep. 30, 2014

(54) NONVOLATILE SEMICONDUCTOR MEMORY DEVICE

(75) Inventor: Makoto Iwai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 13/450,008

(22) Filed: Apr. 18, 2012

(65) Prior Publication Data
US 2013/0051147 A1 Feb. 28, 2013

(30) Foreign Application Priority Data

Aug. 23, 2011 (JP) ................................. 2011-181765

(51) Int. Cl.
*G11C 16/04* (2006.01)
(52) U.S. Cl.
USPC .................................................... 365/185.17
(58) Field of Classification Search
None
See application file for complete search history.

(56) References Cited

U.S. PATENT DOCUMENTS

| 6,643,188 | B2 | 11/2003 | Tanaka et al. | |
|---|---|---|---|---|
| 7,616,502 | B2 | 11/2009 | Iwai | |
| 2002/0003722 | A1* | 1/2002 | Kanda et al. | 365/185.17 |
| 2005/0207229 | A1* | 9/2005 | Takeuchi | 365/185.25 |

FOREIGN PATENT DOCUMENTS

| JP | 2001-332093 A | 11/2001 |
|---|---|---|
| JP | 2003-196988 | 7/2003 |
| JP | 2005-267821 A | 9/2005 |
| JP | 2011-8857 | 1/2011 |
| JP | 2011-60377 | 3/2011 |

OTHER PUBLICATIONS

Office Action issued Mar. 6, 2014, in Japanese Patent Application No. 2011-181765 with English translation.

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A nonvolatile semiconductor memory device includes bit lines, word lines, NAND strings, source lines, first and second select gate transistors, and a controller. After giving a first potential to the second select gate transistors, the controller gives a second potential lower than the first potential to the second select gate transistors, gives a third potential to the memory cells which are insufficient in the writing, gives a fourth potential higher than the third potential to the memory cells which are just before completion of the writing, and gives a fifth potential higher than the fourth potential to the memory cells which are completed in the writing. The first potential is capable of turning on the second select gate transistors. The second potential is capable of turning off the second select gate transistors.

24 Claims, 13 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-181765, filed on Aug. 23, 2011; the entire contents of which are incorporated herein by reference.

FIELD

Embodiments described herein relate generally to a nonvolatile semiconductor memory device.

BACKGROUND

There is a flash memory as a kind of writable and erasable nonvolatile semiconductor memory device. In the flash memory, writing of information is performed by injecting electrons in a charge storage layer through the use of a quantum tunneling effect. Electron injection is performed by causing a potential difference between a control gate and a channel of a transistor constituting a memory cell.

Methods for recording information includes a method for recording one-bit information using a binary of "Hi" or "Low" according to a stored amount of electrons in the charge storage layer of one memory cell, i.e., according to distribution of threshold values depending on an amount of charge. In addition to that, there is also included a method for recording two-bit information using, for example, a quaternary by finely separating distribution of threshold values caused depending on an amount of charge of a floating gate.

Methods for giving a threshold value of a quaternary to a memory cell transistor with high accuracy include a step-up writing method. This method is a method for writing data while increasing a write potential at a constant rate. In the method, it is determined whether or not additional writing is needed for each writing, or whether or not writing has been completed so that a threshold potential does not increase too much.

DETAILED DESCRIPTION

In general, according to one embodiment, a nonvolatile semiconductor memory device includes: a plurality of bit lines; a plurality of word lines; a plurality of NAND strings in which memory cell transistors are connected in series, each of the memory cell transistors having a memory cell and connected to one of the plurality of word lines, and neighboring memory cell transistors sharing a source/drain thereof; a plurality of source lines; a plurality of first select gate transistors, one of a drain and a source of each of the first select gate transistors being connected to one of the source lines, and another of the drain and the source of the each of the first select gate transistors being connected to one of the NAND strings; a plurality of second select gate transistors, one of a drain and a source of each of the second select gate transistors being connected to one of the bit lines, and another of the drain and the source of the second select gate transistors being connected to one of the NAND strings; and a controller, wherein a page including the each of the memory cell transistors of the plurality of NAND strings by sharing one of the plurality of word lines as a gate, in writing in the memory cell, after giving a first potential to the second select gate transistors, the controller giving a second potential lower than the first potential to the second select gate transistors, giving a third potential to the memory cells which are connected to one of the bit lines and are insufficient in the writing, giving a fourth potential higher than the third potential to the memory cells which are connected to one of the bit lines and are just before completion of the writing, and giving a fifth potential higher than the fourth potential to the memory cells which are connected to one of the bit lines and are completed in the writing, the controller giving a write potential to a selected word line of the word lines after giving the second potential, and the first potential being a potential which is capable of transferring the third potential to the one of the NAND strings by turning on the second select gate transistors, and the second potential being a potential which is capable of turning off the second select gate transistors after transferring the third potential to the one of the NAND strings.

(First Embodiment)

Various embodiments will be described hereinafter with reference to accompanying drawings.

First, will be described a configuration of a nonvolatile semiconductor memory device 21 according to a first embodiment.

Figure 1:
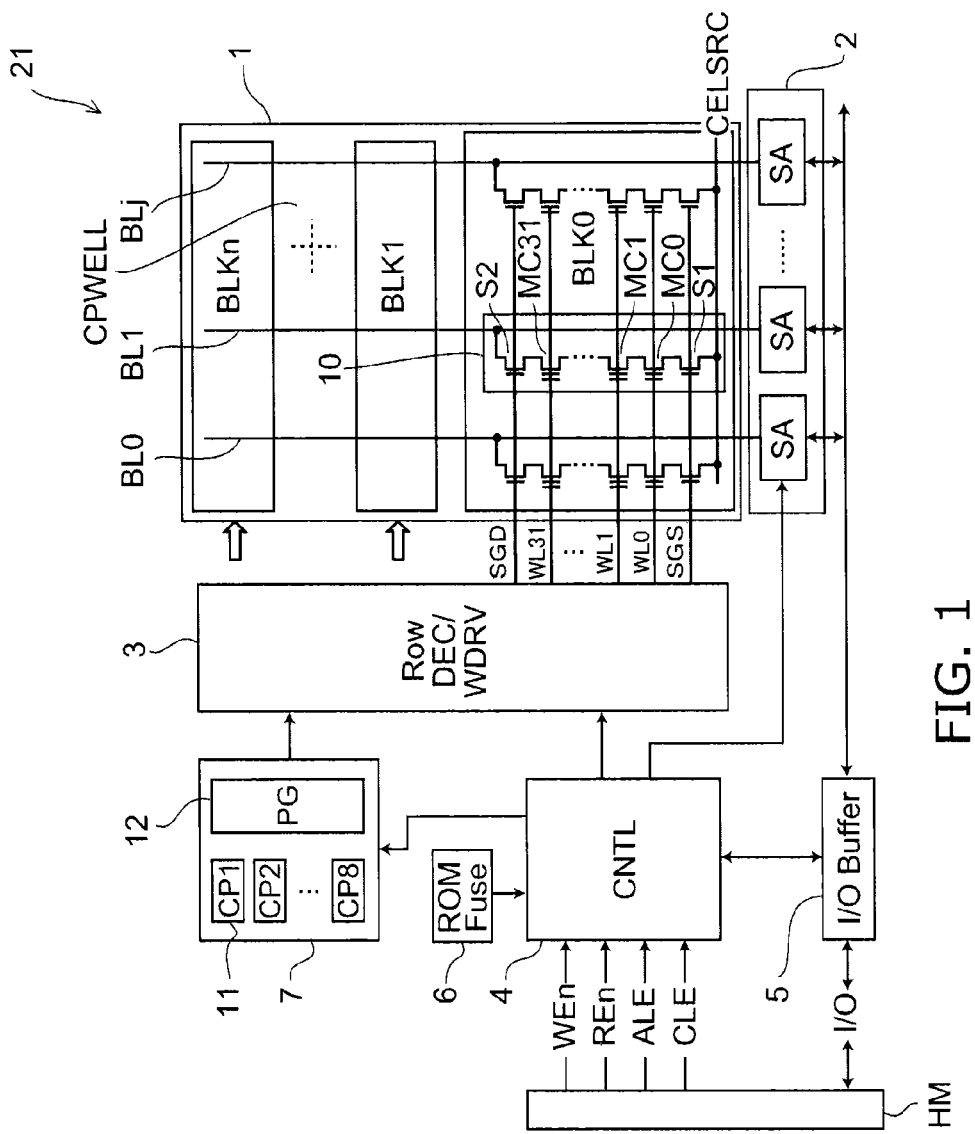
FIG. 1 is a block diagram illustrating a nonvolatile semiconductor memory device according to a first embodiment.

FIG. 1 is a block diagram illustrating the nonvolatile semiconductor memory device according to the first embodiment.

Figure 2:
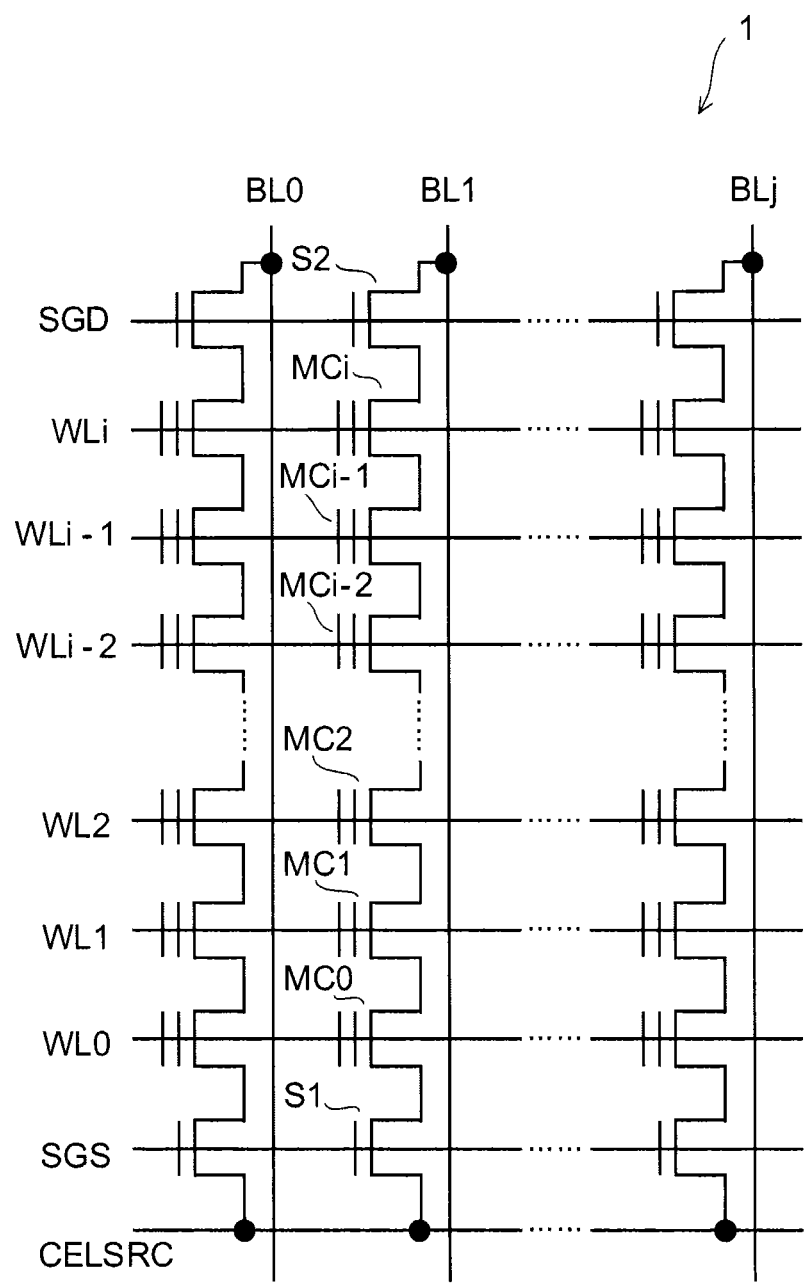
FIG. 2 is a diagram illustrating a memory cell transistor array according to the first embodiment.

FIG. 2 is a diagram illustrating a memory cell transistor array according to the first embodiment.

Figure 3:
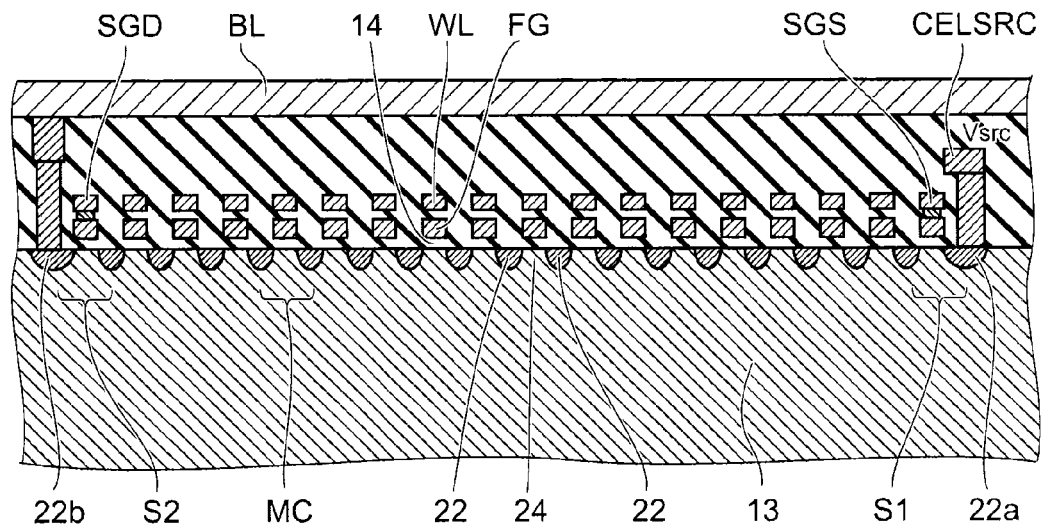
FIG. 3 is a cross-sectional view illustrating an NAND string according to the first embodiment.

FIG. 3 is a cross-sectional view illustrating an NAND string according to the first embodiment.

Figure 4:
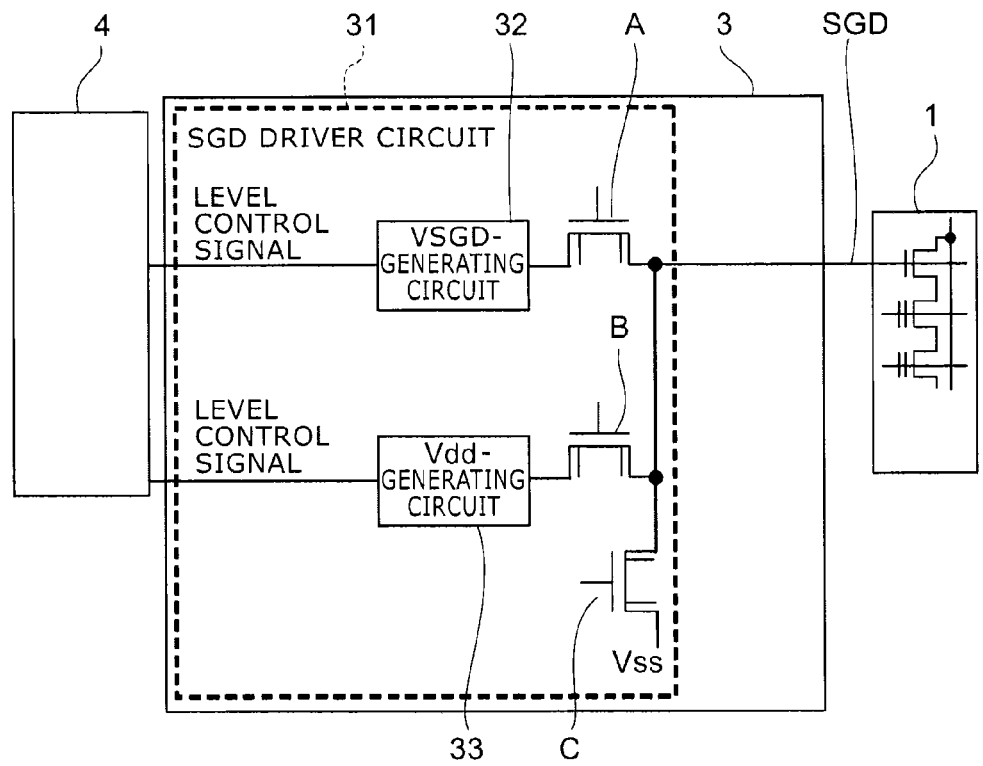
FIG. 4 is a block diagram illustrating an SGD driver circuit according to the first embodiment.

FIG. 4 is a block diagram illustrating an SGD driver circuit according to the first embodiment.

As shown in FIGS. 1 to 3, the nonvolatile semiconductor memory device 21 according to the embodiment is provided with: a memory cell transistor array 1; a sense amplifier circuit 2; a row decoder 3; a controller 4; an input/output buffer 5; a ROM fuse 6, and a voltage generating circuit 7.

First, the memory cell transistor array 1 will be described.

The memory cell transistor array 1 is provided with a NAND cell unit 10 arranged in a matrix form.

One NAND cell unit 10 is provided with a plurality of memory cell transistors MC (MC0, MC1, . . . , and MC31, and hereinafter referred to as a "cell MC") connected in series, and select gate transistors S1 and S2 connected to both ends of the cell MC.

The select gate transistor S1 is, for example, an n-channel type transistor. A source 22a of the select gate transistor S1 is connected to a common source line CELSRC, and a drain 22b of the select gate transistor S2 is connected to bit lines BL (BL0, BL1, . . . , and BLj). The plurality of bit lines BL are provided and extend in a direction perpendicular to the common source line CELSRC.

The cell MC is, for example, an n-channel type transistor. The cell MC is provided, for example, on a silicon substrate 13. A cell well (CPWELL) is formed in an upper layer portion of the silicon substrate 13, and the memory cell transistor array 1 is formed in this cell well. A plurality of active areas divided by STI (shallow trench isolation) are formed on an upper layer portion of the cell well. A conductivity type of the active area is a p-type. Additionally, sources/drains 22, which are a plurality of n-type impurity regions, are formed isolated from each other in the active area. A portion between the source/drain 22 in the active area serves as a channel 24. A gate insulating film 14 (tunnel insulating film) is formed on the channel 24. A charge storage layer FG is formed on the gate insulating film 14 as a charge storage layer. In the embodiment, a case where the charge storage layer is a floating gate will be described as an example. However, the charge storage layer may be a charge trap film. A control gate electrode is formed on the charge storage layer FG via a gate-to-gate insulating film.

In each NAND cell unit 10, the above-described plurality of cells MC are connected in series by sharing the source/drain 22 to constitute the NAND string. The NAND string extends in a direction where the bit lines BL extend. One end of the NAND string is connected to the drain 22b in the select gate transistor S1, and the other end thereof is connected to the source 22a in the select gate transistor S2. Accordingly, the NAND cell unit 10 is a unit formed by connecting the select gate transistors S1 and S2 to the both ends of the NAND string.

Control gates of the cells MC in the NAND cell unit 10 are each composed of a plurality of different word lines WL (WL0, WL1, . . . , and WL31). The word lines WL extend in a direction where the common source line CELSRC extends.

Gates of the select gate transistors S1 and S2 are each connected to select gate lines SGS and SGD parallel to the word lines WL. A set of the plurality of cells MC that share the one word line WL with each other configures one page. Two pages are configured when two bits of data are written in one cell MC, and three pages are configured when three bits of data are written in one cell MC. The above-described set of the plurality of cells MC in which one word line configures the gate is called a "cell MC configuring a page". A set of the plurality of NAND cell units 10 that share the word lines WL and the select gate lines SGS and SGD configures a block BLK used as a unit of data erasing. The number of word lines WL is not limited to thirty-two, but may be sixteen or sixty-four, or the word lines WL may include some dummy word lines.

In the memory cell transistor array 1, the plurality of blocks BLK (BLK0, BLK1, . . . , and BLKn) are disposed in the direction of the bit lines BL.

Next, configurations other than the configuration of the memory cell transistor array 1 will be described.

To the bit lines BL of the memory cell transistor array 1, a sense amplifier circuit 2 that configures a page buffer for sensing read data and holding write data, and that includes a plurality of sense amplifiers SA, is connected. The sense amplifier circuit 2 includes a column select gate.

The row decoder 3 includes a word line driver and an SGD driver circuit 31, and selects and drives the word line WL and the select gate lines SGD and SGS.

The controller 4 receives external control signals, such as a write enable signal WEn, a read enable signal REn, an address latch enable signal ALE, and a command latch enable signal CLE from a host or a memory cell controller HM, and controls an entire memory operation.

In addition, the controller 4 includes a command interface and an address hold/transfer circuit, and determines whether supplied data is write data or address data. Depending on the determination result, the write data is transferred to the sense amplifier circuit 2, and the address data is transferred to the row decoder 3 or the sense amplifier circuit 2.

Furthermore, the controller 4 performs reading, sequence control of writing/erasing, control of an applied voltage, etc. based on the external control signals. In addition, the controller 4 controls the SGD driver circuit 31 by transmitting a control signal to the SGD driver circuit 31, and applies a gate potential to the gate of the select gate transistor S2.

The input/output buffer 5 performs data transmission/reception between the sense amplifier circuit 2 and the external input/output terminals I/O, and also receives data and address data to be stored in a memory cell. The data and address data to be stored in the memory cell are sent to the external input/output terminals I/O from the host or the memory controller HM.

The ROM fuse 6 can store pulse widths and pulse heights of pulse voltages of a write operation and an erasing operation as voltage setting data. Similarly, the ROM fuse 6 can also store the number of times of writing and the number of times of erasing as voltage setting data.

The voltage generating circuit 7 is provided with a plurality of (for example, eight) booster circuits 11 and a pulse generating circuit 12. The booster circuits 11 can be each composed of a well-known charge pump circuit. The voltage generating circuit 7 shifts the number of the booster circuits 11 to be driven based on the control signal from the controller 4, and further controls the pulse generating circuit 12 to adjust, for example, the pulse width and the pulse height of the pulse voltage.

Next, the SGD driver circuit 31 will be described.

As shown in FIG. 4, the SGD driver circuit 31 is provided in the row decoder 3.

The SGD driver circuit 31A is provided with a VSGD generating circuit 32, a Vdd generating circuit 33, a transistor A, a transistor B, and a transistor C.

Any one of a source and a drain of the transistor A is connected to the VSGD generating circuit 32, and the other one is connected to the select gate line SGD.

Any one of a source and a drain of the transistor B is connected to the Vdd generating circuit 33, and the other one is connected to the select gate line SGD.

Any one of a source and a drain of the transistor C is connected to a power supply Vss (for example, 0V), and the other one is connected to the select gate line SGD.

The VSGD generating circuit 32 can generate a gate potential $V_{sgd}$ and $V_{sgdL}$ as a gate potential of the select gate transistor S2.

The Vdd generating circuit 33 can generate a power supply potential Vdd of the other circuit, and Vdd can be shared as a gate potential $V_{sgdL}$ of the gate potential of the select gate transistor S2.

Next, an operation of the nonvolatile semiconductor memory device 21 according to the embodiment will be described.

Figure 5:
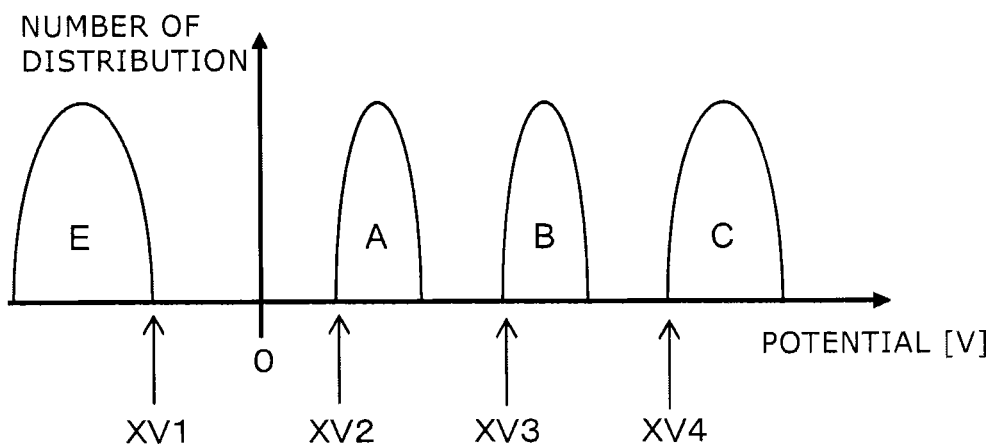
FIG. 5 is a graph illustrating distributions of threshold values of the memory cell transistor according to the first embodiment.

FIG. 5 is a graph illustrating distributions of threshold values of the memory cell transistor according to the first embodiment, and a horizontal axis indicates potentials and a vertical axis indicates the number of distributions.

Figure 6:
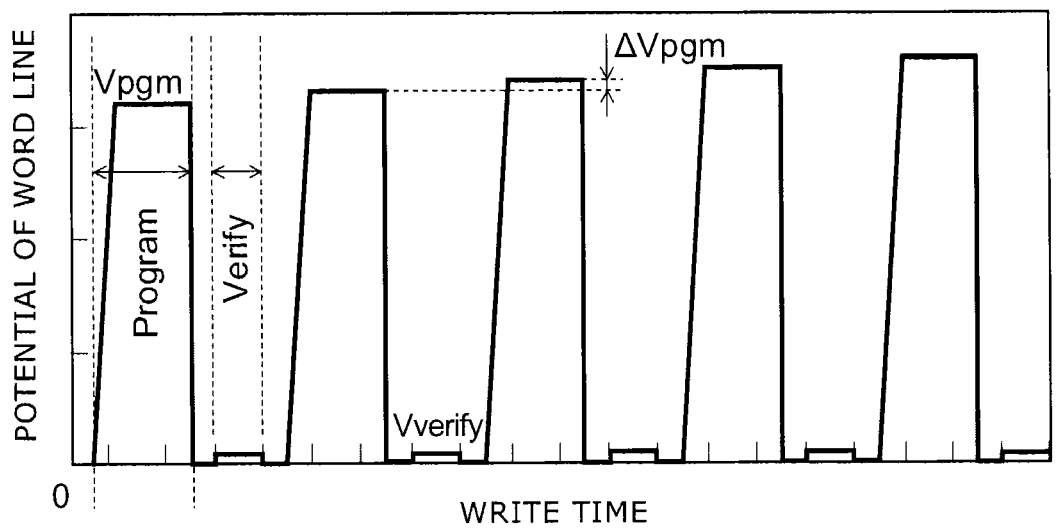
FIG. 6 is a timing chart illustrating step-up writing according to the first embodiment.

FIG. 6 is a timing chart illustrating step-up writing according to the first embodiment, and a horizontal axis indicates write times and a vertical axis indicates potentials of a word line.

Figure 7:
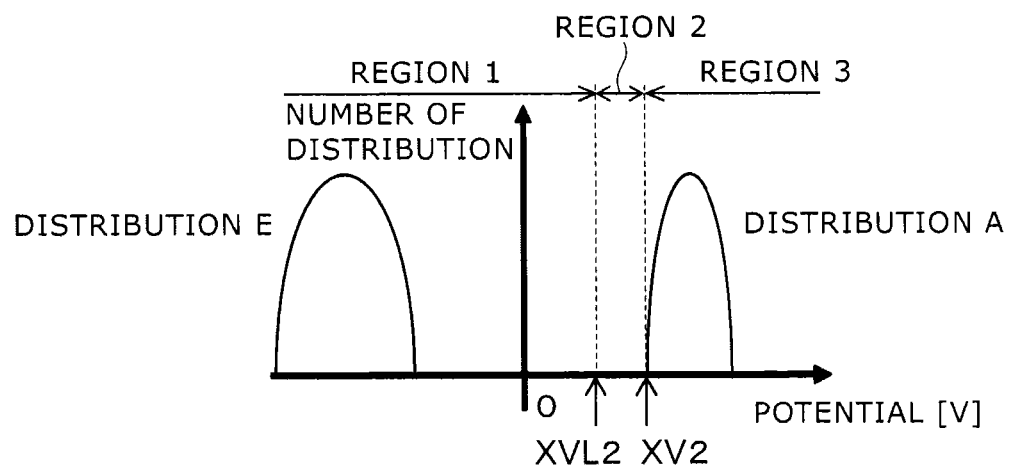
FIG. 7 is a graph illustrating distributions of threshold values of the memory cell transistor in a so-called quick pass write method according to the first embodiment.

FIG. 7 is a graph illustrating distributions of threshold values of the memory cell transistor in a so-called quick pass write method according to the first embodiment, and a horizontal axis indicates potentials and a vertical axis indicates the number of distributions.

Figure 8:
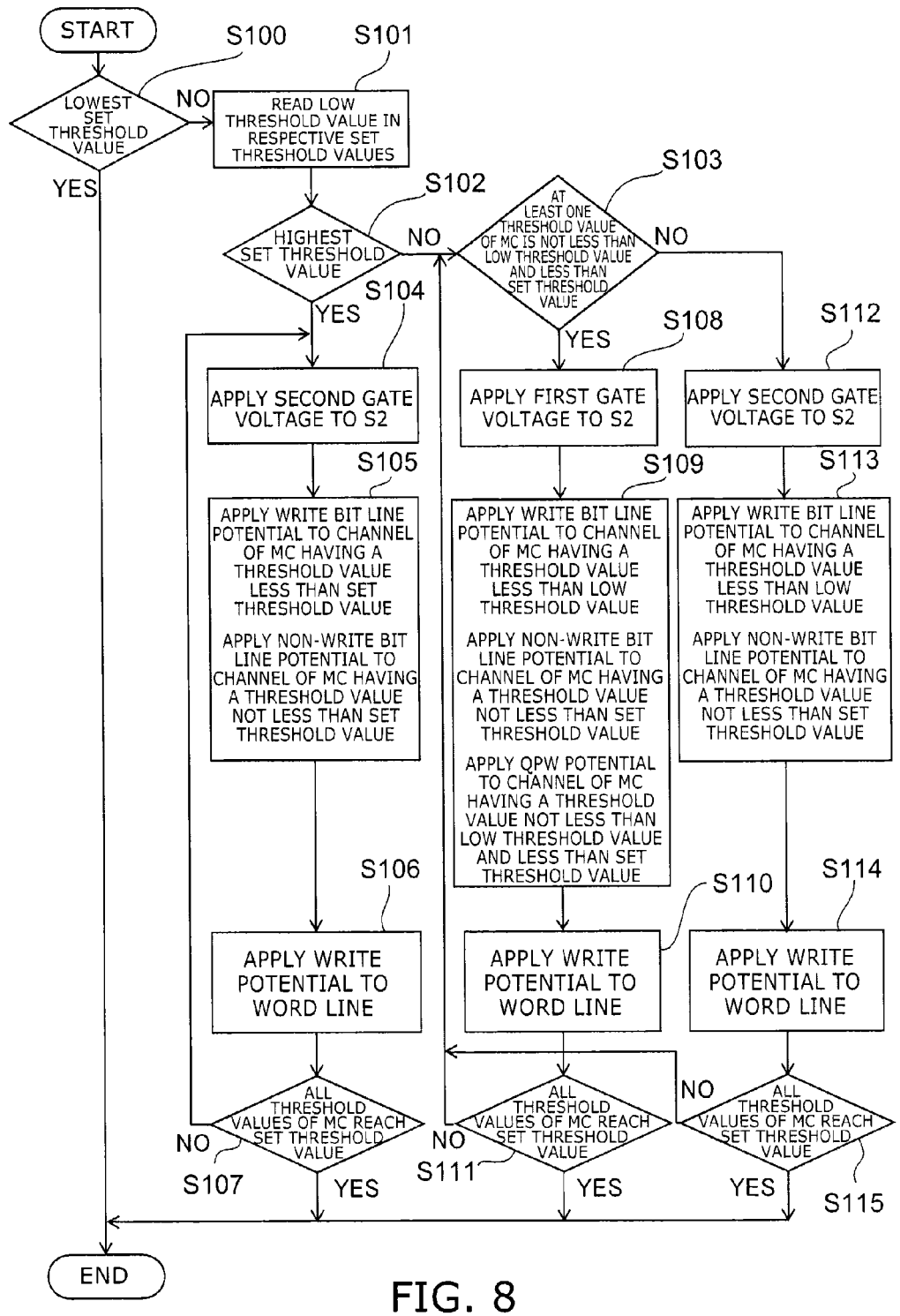
FIG. 8 is a flow chart illustrating a write operation according to the first embodiment.

FIG. 8 is a flow chart illustrating a write operation according to the first embodiment.

Figure 9:
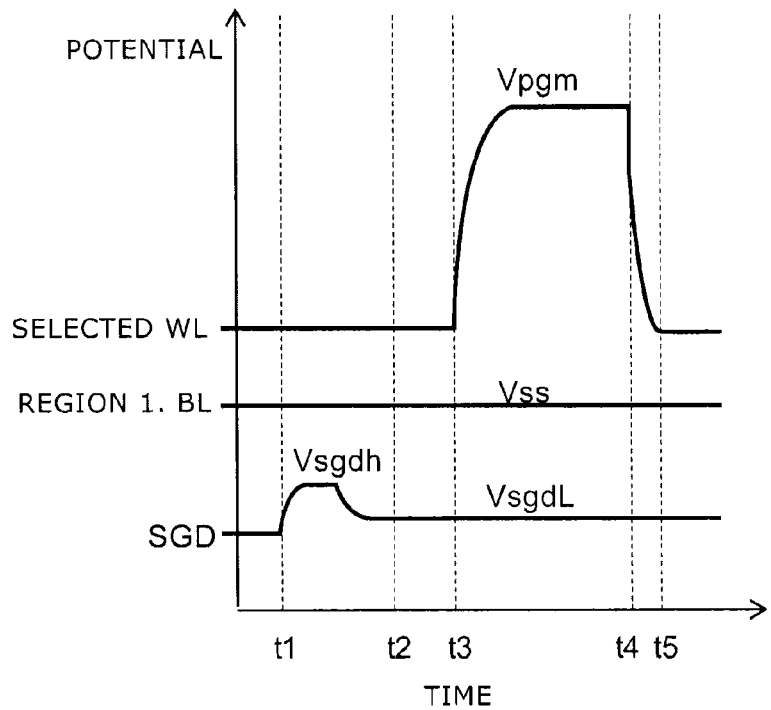
FIG. 9 is a timing chart illustrating potentials of a word line, a bit line, and a select gate line according to the first embodiment.
Figure 12:
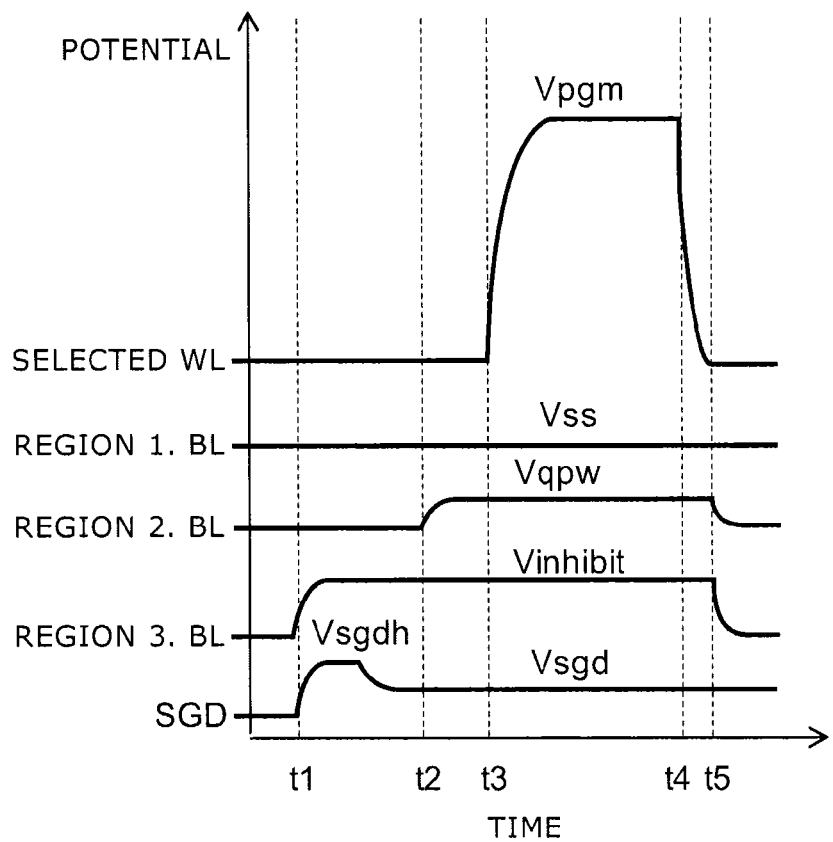
FIG. 12 is a timing chart illustrating potentials of a word line, a bit line, and a select gate line according to the first embodiment.
Figure 17:
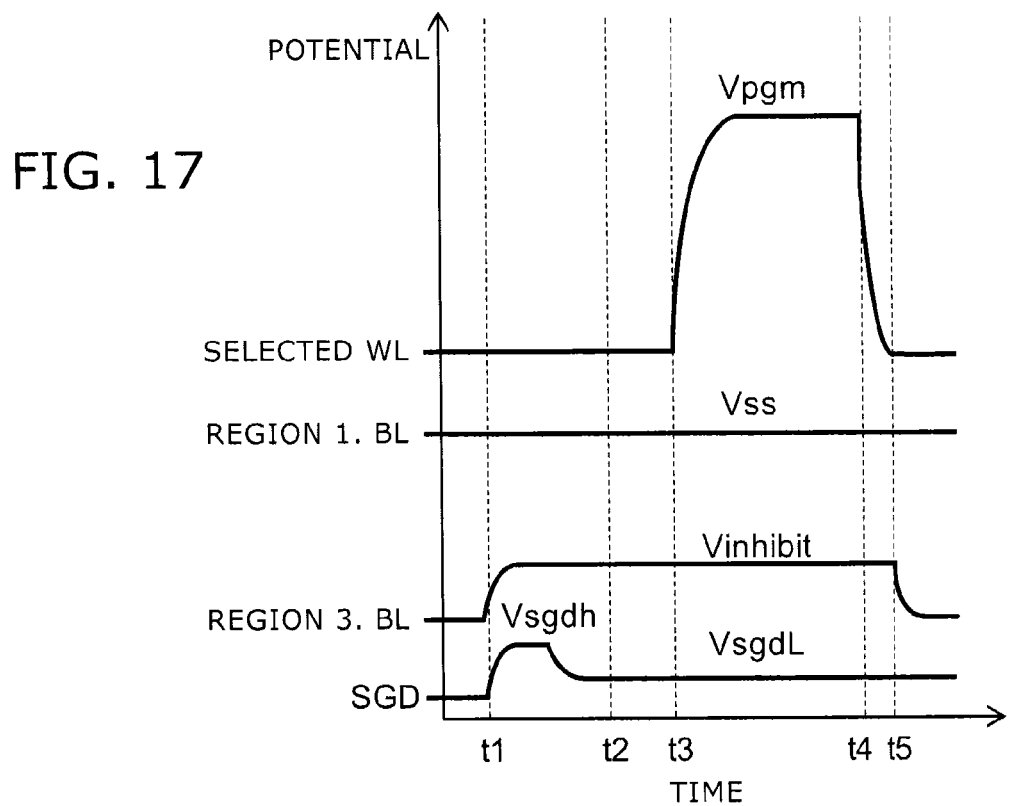
FIG. 17 is a timing chart illustrating potentials of a word line, a bit line, and a select gate line according to the first embodiment.

FIGS. 9, 12, and 17 are timing charts illustrating potentials of a word line, a bit line, and a select gate line according to the first embodiment, and horizontal axes indicate times and vertical axes indicate potentials.

Figure 10:
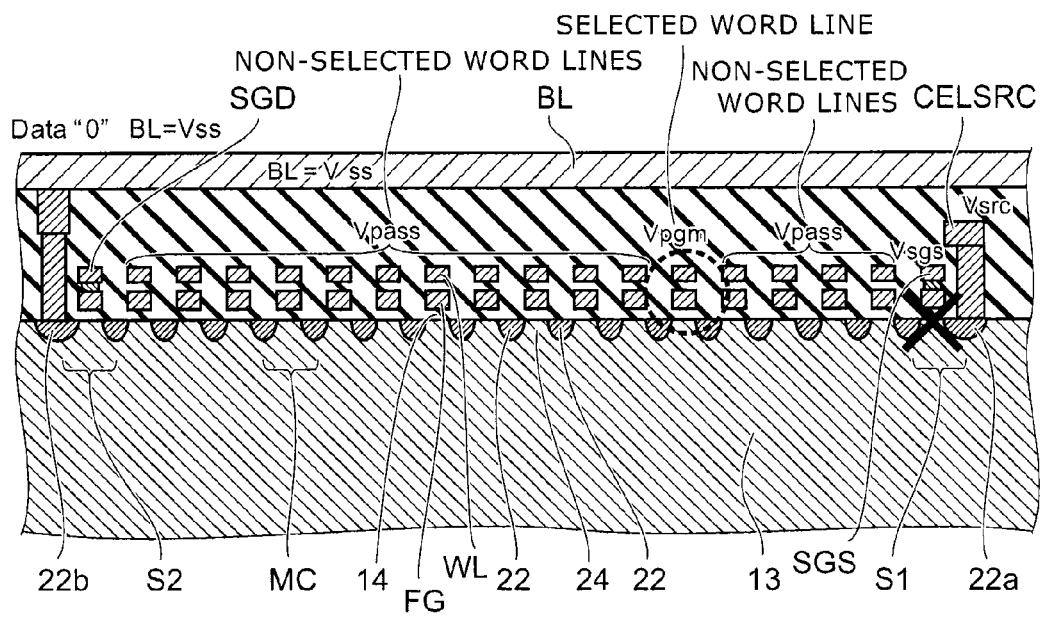
FIG. 10 is a cross-sectional view illustrating an NAND string according to the first embodiment.
Figure 13:
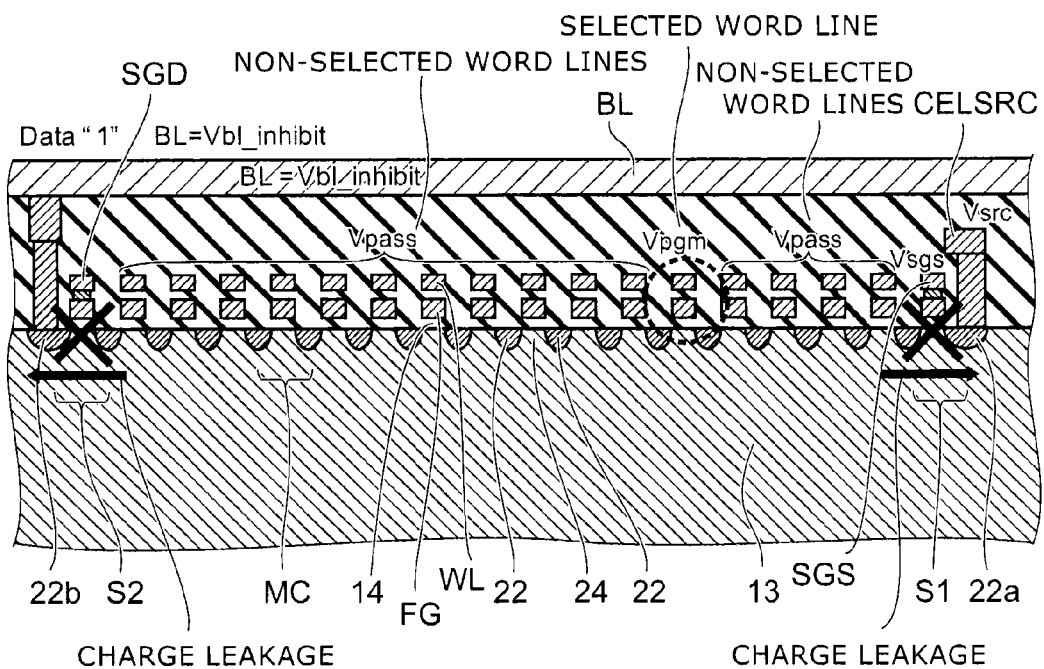
FIG. 13 is a cross-sectional view illustrating an NAND string according to the first embodiment.
Figure 15:
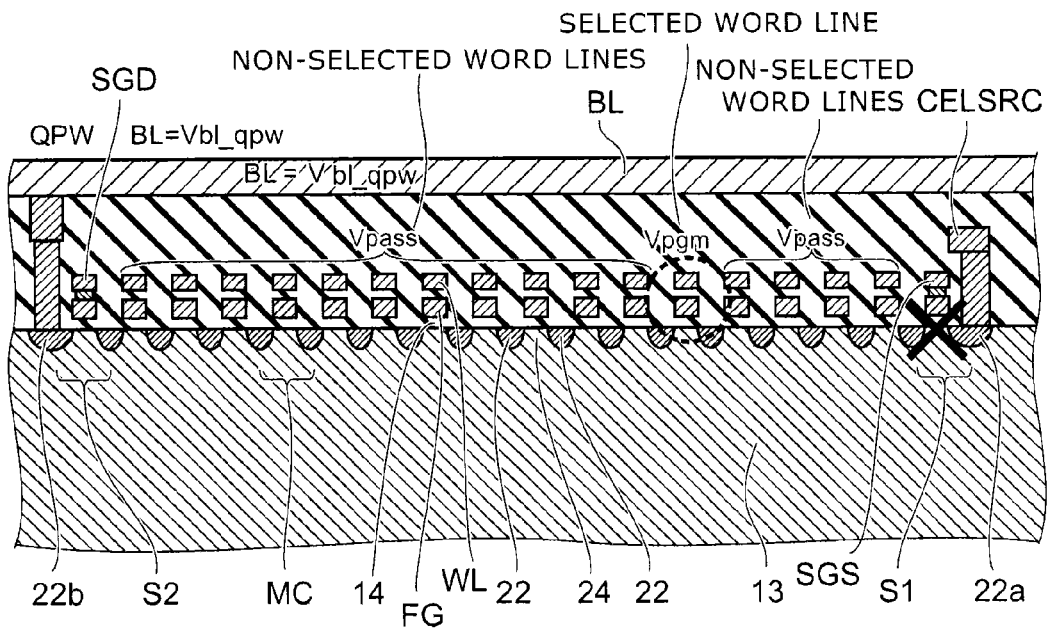
FIG. 15 is a cross-sectional view illustrating an NAND string according to the first embodiment.

FIGS. 10, 13, and 15 are cross-sectional views illustrating an NAND string according to the first embodiment.

Figure 11:
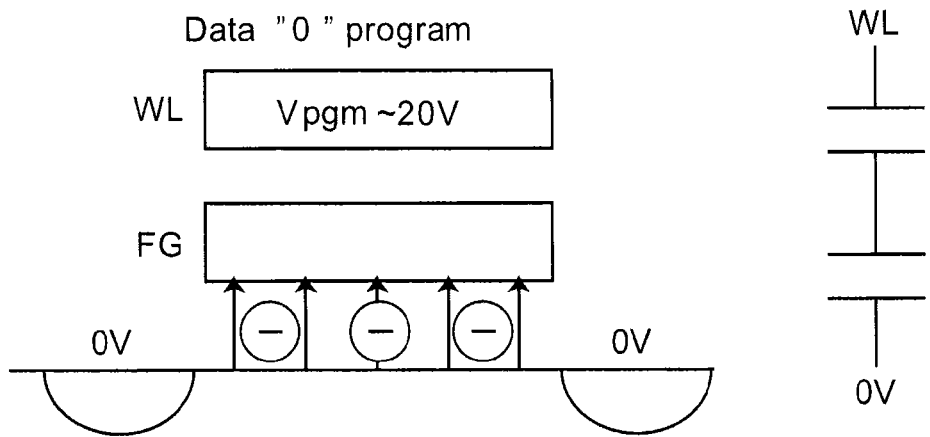
FIG. 11 is a cross-sectional view illustrating the memory cell transistor according to the first embodiment.
Figure 14:
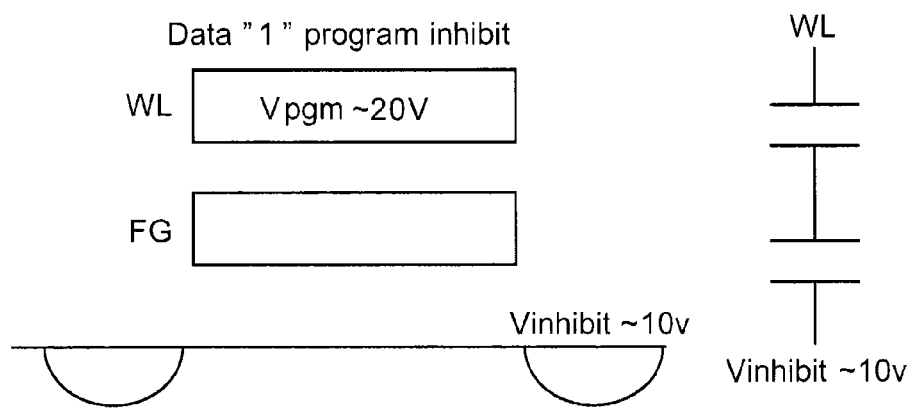
FIG. 14 is a cross-sectional view illustrating the memory cell transistor according to the first embodiment.
Figure 16:
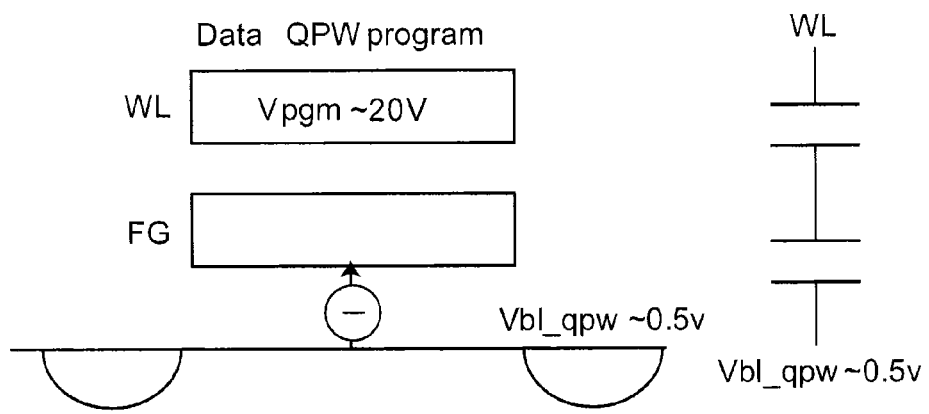
FIG. 16 is a cross-sectional view illustrating the memory cell transistor according to the first embodiment.

FIGS. 11, 14, and 16 are cross-sectional views illustrating the memory cell transistor according to the first embodiment.

As shown in FIG. 5, three or more mutually different set threshold values, for example, threshold value distributions E, A, B, and C (hereinafter may be simply referred to as "distributions E, A, B and C") are set for the cell MC according to the embodiment.

A lower limit of each distribution excluding the distribution E is determined by set threshold values XV2 to XV4. In addition, an upper limit of the distribution E is determined by an erase threshold value XV1. Here, distributions of the cells MC indicating threshold values not less than the respective set threshold values XV2 to XV4 are defined as the distributions A, B, and C. In addition, a distribution of the cell MC indicating a threshold value not more than the erase threshold value XV1 is defined as the distribution E. Two-bit data, for example, '11', '10', '00', and '01' are each allocated to the cells MC belonging to the distributions E, A, B, and C. In the write operation, for example, a threshold value of the cell MC is changed so that the allocated data may move from an '11' state to a '10' state, from '10' to '00', and from '11' to '01'. However, the allocation of the data, the way of moving data may be other than the above.

For example, if a set threshold value is set to be an XV2, the cell MC having a threshold value exceeding the set threshold value XV2 is determined to be completed in writing, and is controlled not to be written at the next writing.

Next, step-up writing will be described.

As shown in FIG. 6, at a first time of writing, an initial write potential (Initial $V_{pgm}$) is applied to the word line WL configuring the gate of the cell MC as a write potential. Additionally, the write potential is applied to the word line WL plural times until the threshold value of the cell MC reaches the set threshold value. It is verified whether the threshold value of the cell MC has reached the set threshold value whenever the write potential is applied to the word line WL. Here, the write potential $V_{pgm}$ is gradually increased (hereinafter may be referred to as "step-up writing").

For example, first, a potential of the word line WL is started and, for example, 15 V is applied as the first initial write potential (Initial $V_{pgm}$). Subsequently, the potential is kept to be 15 V and after that, it is decreased to 0 V. Here, a waveform of the potential becomes pulsed. Next, the threshold value of the cell MC is read and verified (hereinafter may be referred to as "VERIFY") whether additional writing is needed or writing has been completed. Further, the potential of the word line WL is started, and a potential higher than the Initial $V_{pgm}$, for example, 15.5 V increased by 0.5 V is applied to the word line WL. This is a second writing. After that, VERIFY is performed, and it is verified whether additional write potential is applied or writing has been completed. Writing and reading of such pulsed potential are repeated. The repeated writing and reading are called "loop". A relation between the write potential $V_{pgm}$ and the number of times n of a write pulse can be expressed by the following Equation (1).

$$V_{pgm} = (\text{Initial } V_{pgm}) + (n-1) \times \Delta V_{pgm} \quad (1)$$

$\Delta V_{pgm}$ is a potential increased for every time, and it is, for example, 0.5 V.

Next, writing in the quick pass write method (hereinafter referred to as a "QPW method") will be described.

As shown in FIG. 7, the QPW method is a method in which the distributions of the cells MC are controlled by increasing the number of threshold values used as criteria for discriminating states of the cells MC.

In FIG. 7, two distributions of the threshold values of the cells MC shown in FIG. 5, for example, only the distributions E and A are shown.

When the QPW method is performed, three states of the threshold potentials of the cells MC are discriminated. Therefore, a threshold value XVL2 lower than the set threshold value XV2 is set in addition to the set threshold value XV2.

Additionally, threshold value distributions of the cells MC are controlled based on the two threshold values, the set threshold value XV2 and the low threshold value XVL2.

A cell MC in a state of a region 1, i.e., a cell MC having a threshold value less than the low threshold value XVL2, is a cell MC in a state of being insufficient in writing. Accordingly, since a potential difference between the threshold value of the cell MC in a state of the region 1 and the set threshold value XV2 is large, an amount of movement of the threshold value of the cell MC in a state of the region 1 is relatively largely increased in the next writing.

A cell MC in a state of a region 2, i.e., a cell MC having a threshold value not less than the low threshold value XVL2 and less than the set threshold value XV2, is a cell MC in a state just before completion of writing. Accordingly, since a potential difference between the threshold value of the cell MC in a state of the region 2 and the set threshold value XV2 is small, an amount of movement of the threshold value of the cell MC in a state of the region 2 is relatively slightly increased in the next writing. This is because when the threshold value of the cell MC in a state of the region 2 is relatively largely increased, a range of the horizontal axis of the distribution A widens beyond the set threshold value XV2 to thereby overlap with the distribution B.

A cell MC in a state of a region 3, i.e., a cell MC having a threshold value not less than the set threshold value XV2, is a cell MC in a state of being completed in writing. Accordingly, since the threshold value of the cell MC in a state of the region 3 exceeds the set threshold value XV2, the threshold value of the cell MC in the state of the region 3 is not increased in the next writing.

Next, a write operation according to the embodiment utilizing the above-described step-up writing and writing in the QPW method will be described.

(1. A Case where Writing is not Performed from the Distribution E)

As shown in step S100 of FIG. 8, when threshold values of at least a part of the cells MC in which the plurality of cells MC share the one word line WL as the gate, i.e., which configure a page, are not written from the distribution E, writing is not performed. That is, the threshold value is not written from the distribution E when all the write data are data allocated to the distribution E. This is because the threshold values of the cells MC configuring the page belong to an erasing state (the distribution E) before initial writing.

Additionally, as shown in step S101, low threshold values XVL2 to XVL4 lower than the respective set threshold values XV2 to XV4 are newly set for the respective set threshold values XV2 to XV4 among the set threshold values along with the respective set threshold values XV2 to XV4. These low threshold values XVL2 to XVL4 are, for example, read into a latch circuit of the sense amplifier SA to be stored temporarily.

(2. A Case where the Threshold Values of the Cells MC are Changed to any Set Threshold Value Other than the Highest Set Threshold Value XV4)

(2-1. First Writing)

First, as shown in step S102, a case will be described where the threshold values of at least the part of the cells MC configuring the page are changed from the distribution E to any set threshold value other than the highest set threshold value XV4, for example, to the set threshold value XV2.

To begin with, first writing will be described. As shown in step S103, if the threshold value of the cells MC configuring the page is less than the low threshold value XVL, the program proceeds to step S112.

As shown in step S112 of FIGS. 8 and 9, a potential $V_{sgdh}$ higher than the gate potential $V_{sgdL}$ is applied to the select gate line SGD connected to the gate of the select gate transistor S2 between times t1 and t2, and $V_{inhibit}$ is transferred to a channel of a non-writing cell MC. After that, the gate potential $V_{sgdL}$ is applied at the time t2. The gate potential $V_{sgdL}$ is a potential obtained by adding a transfer margin of a write bit line potential $V_{ss}$ (for example, 0V) to a threshold value of the select gate transistor S2.

A gate potential $V_{sgs}$ is applied to the gate of the select gate transistor S1. The gate potential $V_{sgs}$ is, for example, 0 to 0.6 V, which is a potential lower than a threshold value of the select gate transistor S1.

As shown in step S113, a write bit line potential $V_{ss}$ is applied to the bit line BL connected to the cell MC in which data is written, i.e., the cell MC whose threshold value is changed to the set threshold value XV2. The write bit line potential $V_{ss}$ is, for example, 0 V.

Next, as shown in step S114, a write potential $V_{pgm}$ is applied to the selected word line WL in pulses between the times t3 and t4. A write pass potential $V_{pass}$, for example, is applied to the non-selected word line WLs before the time t3 or almost at the same time of the time t3. The write pass potential $V_{pass}$ is a potential larger than an upper limit of the threshold value distribution of the distribution C. However, a voltage other than the write pass potential $V_{pass}$ such as a potential used for local boost scheme and a potential assisting the write potential $V_{pgm}$ may be applied to some of the non-selected word line WLs. The write potential $V_{pgm}$ becomes 0 V at a time t5.

A source potential $V_{src}$, for example, 1 to 2.5 V is applied to a source line CESRC.

As a result, as shown in FIGS. 10 and 11, although the select gate transistor S1 becomes an off-state, the select gate transistor S2 becomes an on-state.

Additionally, the write bit line potential $V_{ss}$ is applied to the channel 24 of the cell MC via the bit line BL.

An electric field is generated in a tunnel insulating film due to a potential difference between the write potential $V_{pgm}$ applied to the word line WL and the channel, and electrons are injected into the charge storage layer FG by FN tunneling. As a result, the threshold value of the cell MC changes.

After that, as shown in step S115, the threshold value of the cell MC is verified. The program returns to an operation of step S103 until all the threshold values reach the set threshold value.

(2-2. Writing after Second Writing)

Next, a case will be described as shown in step S103 of FIG. 8 where a write loop is executed not less than once, and at least one threshold value of the cells MC configuring the page becomes not less than the low threshold value XVL2 and less than the set threshold value XV2. Since writing is performed by one page unit, it can be said that in the above described case, mixedly existed are the cells MC in a state of being insufficient in writing, the cells MC in a state just before completion of writing, and the cells MC in a state of being completed in writing.

As shown in step S108 of FIGS. 8 and 12, the potential $V_{sgdh}$ higher than the gate potential $V_{sgd}$ is applied to the gate of the select gate transistor S2 between the times t1 and t2, and $V_{inhibit}$ is transferred to the channel of the non-writing cell MC. After that the gate potential $V_{sgd}$ is applied after the time t2. The gate potential $V_{sgd}$ is set to be a potential higher than the above-described gate potential $V_{sgdL}$.

The gate potential $V_{sgs}$ is applied to the gate of the select gate transistor S1. The gate potential $V_{sgs}$ is, for example, 0 to 0.6 V, which is a potential lower than the threshold value of the select gate transistor S1.

Next, as shown in step S109, a non-write bit line potential $V_{inhibit}$ is applied to the bit line BL to which the cell MC having a threshold value not less than the set threshold value XV2 has been connected.

In addition, the write bit line potential $V_{ss}$ is applied to the bit line BL to which the cell MC having a threshold value less than the low threshold value XVL2 has been connected.

Furthermore, to the bit line BL to which the cell MC having a threshold value not less than the low threshold value XVL2 and less than the set threshold value XV2 has been connected, a QPW potential $V_{qpw}$ is applied, at which the select gate transistor S2 becomes the on-state, and which is higher than the write bit line potential $V_{ss}$ and lower than the non-write bit line potential $V_{inhibit}$.

In addition, as shown in step S110, the write potential $V_{pgm}$ is applied to the word line WL between the times t3 and t4. The write potential $V_{pgm}$ at this time is boosted to a value obtained by Equation (1) by using the first write potential $V_{pgm}$.

As shown in FIGS. 13 and 14, the select gate transistor S2 connected to the bit line BL to which the non-write bit line potential $V_{inhibit}$ has been applied becomes the off-state. In addition, the select gate transistor S1 is also in the off-state at the time of the time t3. That is, the gate potential $V_{sgdh}$ applied at the time t1 is set to be a value at which the potential $V_{inhibit}$ can be transferred to the channel when the non-write bit line potential $V_{inhibit}$ is applied. The gate potential $V_{sgd}$ is set to turn off the select gate transistor S2 while maintaining a high potential in the channel 24 after the non-write bit line potential $V_{inhibit}$ is transferred to the channel 24. Meanwhile, that is, in an ideal case where leakage, such as off-leakage in the select gate transistor S2, is eliminated, a potential of the channel 24 is raised by capacitive coupling with the word line WL while keeping the non-write bit line potential $V_{inhibit}$ in the channel 24. As a result, at the time of the time t3, an active area also including the channel 24 of the cell MC is electrically separated from the bit line BL and the source line CELSRC to be a floating state. Additionally, the potential of the channel 24 rises due to the capacitive coupling with the word line WL. Consequently, a potential difference between the word line WL and the channel is reduced. As a result, electron injection into the charge storage layer FG does not occur. Consequently, the threshold value of the cell MC does not change.

The select gate transistor S2 connected to the bit line BL to which the write bit line potential $V_{ss}$ has been applied is in the on-state after the potential $V_{sgd}$ is applied at the time t2.

Additionally, the write bit line potential $V_{ss}$ is applied to the channel 24 of the cell MC via the bit line. An electric field is generated in the tunnel insulating film by the potential difference between the write potential $V_{pgm}$ applied to the word line WL and the channel 24 at the time t3, and electrons are injected into the charge storage layer FG. Consequently, the threshold value of the cell MC changes.

As shown in FIGS. 15 and 16, the select gate transistor S2 connected to the bit line BL to which the QPW potential $V_{qpw}$ has been applied is in the on-state. That is, the gate potential $V_{sgd}$ is set so as to turn on the select gate transistor S2 when the QPW potential $V_{qpw}$ is applied to the bit line. Accordingly, the channel 24 of the cell MC becomes the same level of the $V_{qpw}$. As a result, the electric field is generated in the tunnel insulating film due to the potential difference between the write potential $V_{pgm}$ applied to the word line WL and the channel 24 at the time of the time t3, and electron injection into the charge storage layer FG occurs. However, an injection amount of the electrons into the charge storage layer FG is less than in the case where the above-described write bit line potential $V_{ss}$ is applied.

As described above, it becomes possible to control the threshold value distribution to be the distribution A, which does not largely exceed the region 3 by relatively reducing an increased amount of the threshold value of the cell MC in a state of the region 2.

After that, as shown in step S111, it is verified whether or not the threshold values of all the cells MC in which values are to be written have reached the set threshold value. If the threshold values of all the cells MC have reached the set threshold value, the write operation is completed. If the threshold values have not reached the set threshold value, the program returns to step S103. In this way, the above-described operation is repeated until the threshold values of all the cells MC reach the set threshold value.

(3. A Case where the Threshold Values of the Cells MC are Changed to the Highest Set Threshold Value XV4)

Next, a case will be described as shown in step S102 where the threshold values of at least a part of the cells MC configuring the page are changed to the highest set threshold value XV4 among the set threshold values.

In this case, as shown in step S104 of FIGS. 8 and 17, a potential higher than the gate potential $V_{sgdL}$ is applied to the gate of the select gate transistor S2 between the times t1 and t2 and $V_{inhibit}$ is transferred to the channel of the non-writing cell MC. After that, the gate potential $V_{sgdL}$ is applied from the time t2.

Next, as shown in step S105, the non-write bit line potential $V_{inhibit}$ is applied to the bit line BL to which the cell MC having a threshold value not less than the set threshold value XV4 has been connected.

The write bit line potential $V_{ss}$ is applied to the bit line BL to which the cell MC having a threshold value less than the set threshold value XV4 has been connected.

As shown in step S106, the write potential $V_{pgm}$ is applied to the selected word line WL.

As a result, the select gate transistor S2 having been connected to the bit line BL to which the non-write bit line potential $V_{inhibit}$ has been applied becomes the off-state at the time t3. Accordingly, electrons are not injected into the charge storage layer FG of the cell MC. Consequently, the threshold value of the channel 24 of the cell MC does not change.

In contrast, the select gate transistor S2 having been connected to the bit line BL to which the write potential $V_{pgm}$ has been applied becomes the on-state at the time t3. Accordingly, electrons are injected into the charge storage layer FG of the cell MC, and the threshold value of the channel 24 of the cell MC changes.

After that, as shown in step S107, the threshold value of the cell MC is verified. The program returns to an operation of step S104 until the threshold values of all the cells MC reach the set threshold value.

During a time from a first loop to a last loop, repeated are application of the write potential $V_{pgm}$ to the word line WL and verification of whether or not the threshold value of the cell MC is not less than the target set threshold value until the threshold values of all the cells MC reach the target set threshold value. The write potential $V_{pgm}$ is boosted whenever the application and verification are repeated.

Next, a control operation of a gate potential of the select gate transistor S2 will be described.

The controller 4 determines whether a gate potential $V_{sgd}$ or a gate potential $V_{sgdL}$ as a gate potential applied to the gate of the select gate transistor S2, and transfers a control signal to the SGD driver circuit 31.

The VSGD generating circuit 32 provided in the SGD driver circuit 31 generates the gate potential $V_{sgd}$ or $V_{sgdL}$. In addition, the $V_{dd}$ may be transferred from the Vdd generating circuit 33 provided in the SGD driver circuit 31 as the gate potential $V_{sgdL}$.

The SGD driver circuit 31 puts the transistor A into the on-state and puts the transistors B and C into the off-state based on the control signal of the controller 4 that requires the gate potential $V_{sgd}$ or $V_{sdgL}$. As a result, the gate potential $V_{sgd}$ or $V_{sdgL}$ is output from the SGD driver circuit 31.

In contrast, in the case where the voltage $V_{dd}$ is transferred as the $V_{sdgL}$, the SGD driver circuit 31 puts transistor B into the on-state and puts the transistors A and C into the off-state based on the control signal of the controller 4 that requires the gate potential $V_{sgdL}$. As a result, the gate potential $V_{sgdL}$, that is, voltage $V_{ss}$ is output from the SGD driver circuit 31.

The SGD driver circuit 31 puts the transistor C into the on-state and puts the transistors A and B into the off-state when the gate potential $V_{sgd}$ and the gate potential $V_{sgdL}$ are not applied, and the power supply Vss is output from the SGD driver circuit 31.

In the embodiment, when the threshold value of the cell MC is changed to any set threshold value other than a lowest set threshold value and other than the highest set threshold value, the QPW potential is applied to the bit line BL if the threshold value is not less than the low threshold value and not more than the set threshold value. Additionally, the select gate transistor S2 is put into the on-state. For that reason, a potential applied to the gate of the select gate transistor S2 is set to be the gate potential $V_{sgd}$.

When the non-write bit line potential $V_{inhibit}$ is applied to the bit line BL to put the cell MC into a floating state, the potential of the channel of the cell MC rises by the capacitive coupling via gate capacitance. Here, once a gate potential $V_{sgd}$ is defined as the gate potential $V_{sgdh}$ of the select gate transistor S2, whereby after the $V_{inhibit}$ is transferred to the channel of the cell MC completed in writing, the potential of the channel 24 is increased as the gate potential $V_{sgd}$ of the select gate transistor S2, and the QPW potential $V_{qpw}$ is transferred to the channel 24 of the cell MC in a state just before the completion of writing. Accordingly, a writing error can be prevented, and writing in the cell MC can also be performed accurately with the QPW method.

In contrast, when the threshold value of the cell MC is changed to any set threshold value other than the lowest set threshold value and other than the highest set threshold value, the QPW potential is not applied to the bit line BL if the threshold value is less than the low threshold value or not less than the set threshold value, and if the threshold value is changed to the highest set threshold value. This is because of a few requests to narrow a width of the threshold value distribution since the set threshold value is the highest one. Therefore, the gate potential of the select gate transistor S2 can be set to be the gate potential $V_{sgdL}$ lower than the gate potential $V_{sgd}$. Consequently, cut-off characteristics of the select gate transistor S2 can be improved, and leakage from the channel of the cell MC can be reduced. Consequently, the writing error can be prevented.

In addition, since a gate length is not required to make longer in order to reduce the leakage, high integration can be achieved.

In addition, the gate potential $V_{sgdL}$ of the select gate transistor S2 can be shared with a power supply potential Vdd of the nonvolatile semiconductor memory device 21. Consequently, a new power generating circuit is not needed, and the nonvolatile semiconductor memory device 21 can be highly integrated.

It is defined in the embodiment that the VSGD generating circuit 32 provided in the SGD driver circuit 31 generates the gate potential $V_{sgd}$. However, the VSGD generating circuit 32 may generate both the gate potential $V_{sgd}$ and the gate potential $V_{sgdL}$. In this case, the SGD driver circuit 31 causes the VSGD generating circuit 32 to generate a gate potential based on the control signal of the controller 4.

<Variation of First Embodiment>

Next, a variation of the embodiment will be described.

Figure 18:
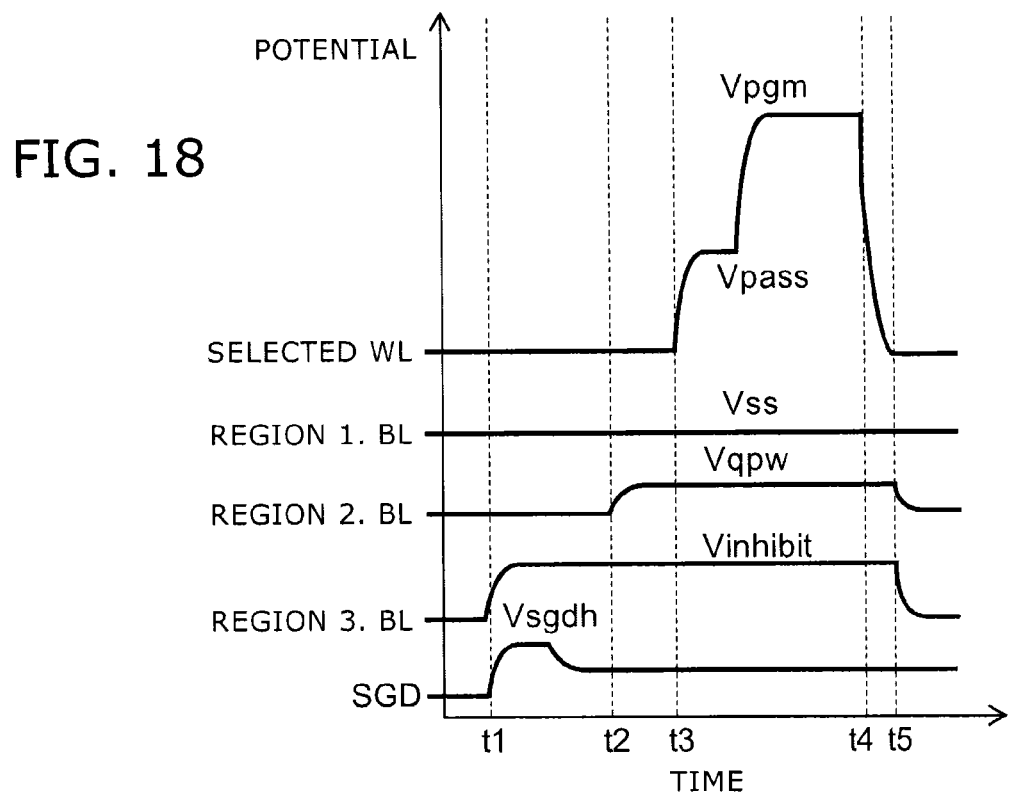
FIG. 18 is a timing chart illustrating potentials of a word line, a bit line, and a select gate transistor according to a variation of the first embodiment.

FIG. 18 is a timing chart illustrating potentials of a word line, a bit line, and a select gate transistor according to the variation, and a horizontal axis indicates times and a vertical axis indicates potentials.

In the variation, a potential applied to a select word line WL is boosted in two stages. That is, the write pass potential $V_{pass}$ lower than the write potential $V_{pgm}$ is applied at a first half between the time t3 and the time t4, and the write potential $V_{pgm}$ is applied at a latter half between the time t3 and the time t4. Potential loss due to a potential difference from adjacent word lines can be reduced by applying the write pass potential $V_{pass}$ lower than the write potential to the word line before the write potential $V_{pgm}$ is applied to the word line.

(Second Embodiment)

Next, a second embodiment will be described.

Figure 19:
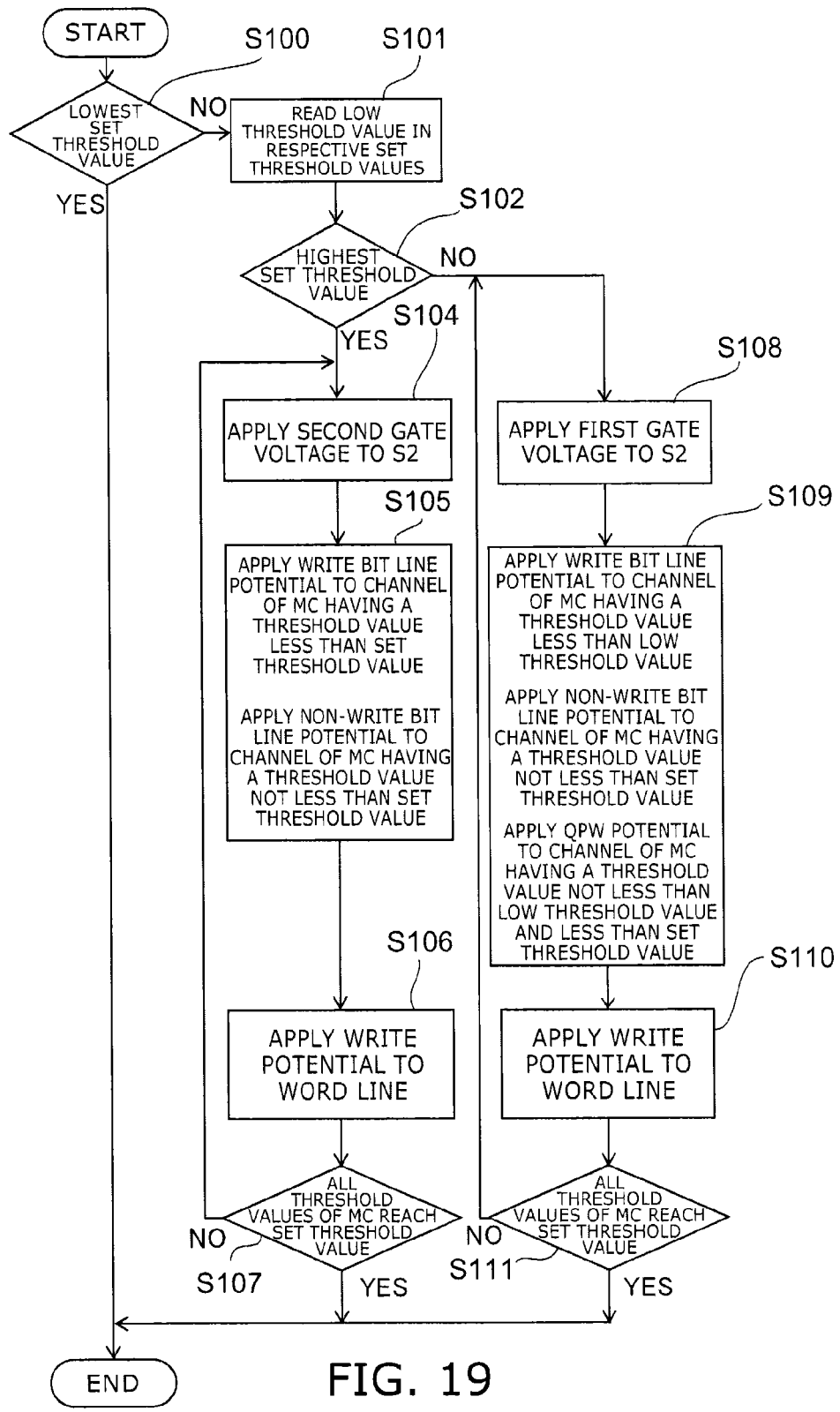
FIG. 19 is a flow chart illustrating a write operation according to a second embodiment.

FIG. 19 is a flow chart illustrating a write operation according to the second embodiment.

A configuration of the nonvolatile semiconductor memory device 21 in the embodiment is the same as the configuration of the above-described first embodiment.

Next, an operation of the nonvolatile semiconductor memory device 21 in the embodiment will be described.

(1. A Case where Writing is not Performed from the Distribution E)

As shown in step S100 of FIG. 19, when the threshold values of the cells MC are set to be the lowest set threshold value, the write operation is not performed like in the case of the above-described first embodiment.

(2. A Case where the Threshold Values of the Cells MC are Changed to any Set Threshold Value Other than the Highest Set Threshold Value)

As shown in step S101 of FIG. 19, when the threshold values of the cells MC are changed to a set threshold value other than a lowest set threshold value, low threshold values set as the respective set threshold values are read.

As shown in step S102, when the threshold values of at least a part of the cells MC configuring the page are changed to any set threshold value other than the lowest set threshold value and other than the highest set threshold value, the program proceeds to step S108. Additionally, the gate potential $V_{sgd}$ is applied to the gate of the select gate transistor S2 at the time of the write operation.

Next, as shown in step S109, the non-write bit line potential $V_{inhibit}$ is applied to the bit line BL to which the cell MC having a threshold value not less than the set threshold value has been connected.

In addition, the write bit line potential $V_{ss}$ is applied to the bit line BL to which the cell MC having a threshold value less than the low threshold value XVL has been connected.

Furthermore, the QPW potential $V_{qpw}$ is applied to the bit line to which the cell MC having a threshold value not less than the low threshold value XV and less than the set threshold value XV has been connected.

As shown in step S110, the write potential $V_{pgm}$ is applied to the word line WL. This corresponds to step S110.

As a result, the threshold value of the cell MC having been connected to the bit line BL to which the non-write bit line potential $V_{inhibit}$ has been applied, does not change. The threshold value of the cell MC having been connected to the bit line BL to which the QPW potential $V_{qpw}$ has been applied, relatively slightly changes. The threshold value of the cell MC having been connected to the bit line BL to which the write bit line potential has been applied, relatively largely changes.

Additionally, as shown in step S111, the threshold value of the cell MC is verified. If the threshold values of all the cells MC have reached the set threshold value, a write operation is completed. If the threshold values have not reached the set threshold value, the program returns to step S108. In this way, the above-described operation is repeated until the threshold values of all the cells MC reach the set threshold value.

(3. A Case where the Threshold Values of the Cells MC are Changed to the Highest Set Threshold Value)

Next, a case will be described as shown in step S102 where the threshold values of at least a part of the cells MC configuring the page are changed to the highest set threshold value among the set threshold values.

In this case, as shown in step S104, the gate potential $V_{sgdL}$ lower than the gate potential $V_{sgd}$ is applied to the gate of the select gate transistor S2 at the time of the write operation.

Next, as shown in step S105, the non-write bit line potential $V_{inhibit}$ is applied to the bit line BL to which the cell MC having a threshold value not less than the set threshold value XV has been connected.

The write bit line potential $V_{ss}$ is applied to the bit line BL to which the cell MC having a threshold value less than the set threshold value XV has been connected.

After that, as shown in step S106, the write potential $V_{pgm}$ is applied to the word line WL.

As a result, the threshold value of the cell MC having been connected to the bit line BL to which the non-write bit line potential $V_{inhibit}$ has been applied, does not change. The threshold value of the cell MC having been connected to the bit line BL to which the write bit line potential has been applied, changes.

Additionally, as shown in step S107, the threshold value of the cell MC is verified. If the threshold values of all the cells MC have reached the set threshold value, the write operation is completed. If the threshold values have not reached the set threshold value, the program returns to step S104. In this way, the above-described operation is repeated until the threshold values of all the cells MC reach the set threshold value. The write potential $V_{pgm}$ is raised whenever the above-described operation is repeated.

According to the embodiment, in a case where the threshold value is changed to the highest set threshold value, the QPW method is canceled, and the gate potential to be applied to the gate of the select gate transistor S2 is set to be the gate potential $V_{sgdL}$ lower than the gate potential $V_{sgd}$. As a result, as shown in step S103 of FIG. 8 in the above-described first embodiment, since an operation for verifying whether the threshold value of the cell MC is not less than the low threshold value and less than the set threshold value can be omitted, a processing time can be reduced.

(Third Embodiment)

Next, a third embodiment will be described.

Figure 20:
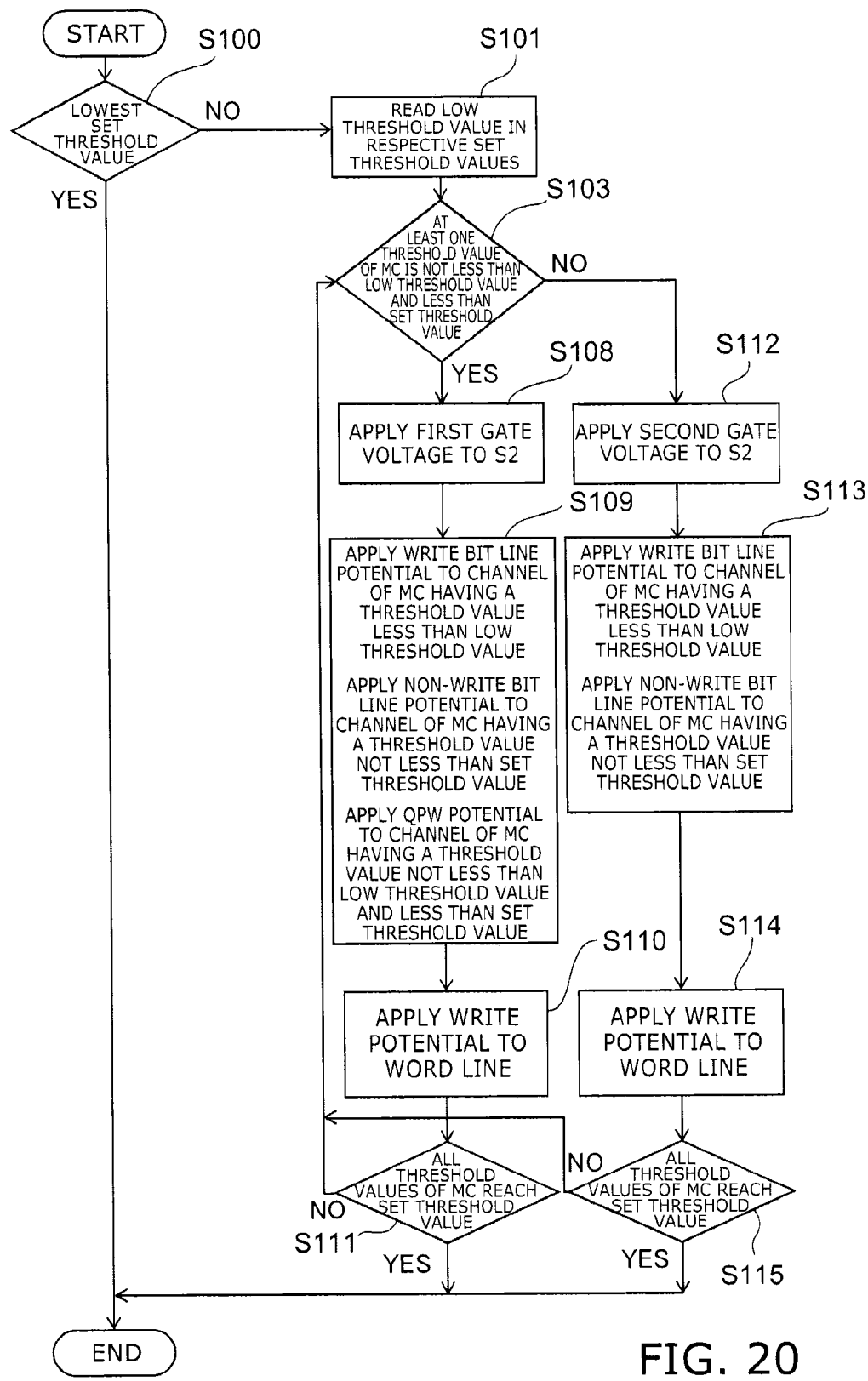
FIG. 20 is a flow chart illustrating a write operation according to a third embodiment.

FIG. 20 is a flow chart illustrating a write operation according to a third embodiment.

A configuration of the nonvolatile semiconductor memory device 21 in the embodiment is the same as the configuration of the above-described first embodiment.

Next, an operation of the nonvolatile semiconductor memory device 21 in the embodiment will be described.

(1. A Case where Writing is not Performed from the Distribution E)

As shown in step S100 of FIG. 20, when the threshold values of the cells MC are set to be the lowest set threshold value, the write operation is not performed like in the case of the above-described first embodiment.

(2. A Case where the Threshold Values of the Cells MC are Changed to any Set Threshold Value)

As shown in step S101, low threshold values set as the respective set threshold values are read.

Next, a case will be described where the threshold values of at least a part of the cells MC configuring the page are changed to any set threshold value other than the lowest threshold value.

As shown in step S103, if the threshold values of the cells MC configuring the page is less than the low threshold value VXL or not less than the set threshold value XV, the program proceeds to step S112. Additionally, the gate potential $V_{sgdL}$ is applied to the gate of the select gate transistor S2.

Next, as shown in step S113, the non-write bit line potential $V_{inhibit}$ is applied to the bit line BL to which the cell MC having a threshold value not less than the set threshold value XV has been connected, and the write bit line potential $V_{ss}$ is applied to the bit line BL to which the cell MC having a threshold value less than the low threshold value XVL has been connected. After that, as shown in step S114, the write potential $V_{pgm}$ is applied to the word line WL.

Additionally, as shown in step S115, the threshold value of the cell MC is verified. If the threshold values of all the cells MC have reached the set threshold value, the write operation is completed. If the threshold values have not reached the set threshold value, the program returns to step S103. In this way, the above-described operation is repeated until the threshold values of all the cells MC reach the set threshold value.

In addition, if the threshold values of at least one cell MC configuring the page is not less than the low threshold value XVL and less than the set threshold value XV, as shown in step S108, the gate potential $V_{sgd}$ is applied to the gate of the select gate transistor S2.

Additionally, as shown in step S109, the non-write bit line potential $V_{inhibit}$ is applied to the bit line BL to which the cell MC having a threshold value not less than the set threshold value XV has been connected, and the write bit line potential $V_{ss}$ is applied to the bit line BL to which the cell MC having a threshold value less than the low threshold value XVL has been connected. The QPW potential $V_{qpw}$ is applied to the bit line BL to which the cell MC having a threshold value not less than the low threshold value XVL and less than the set threshold value XV has been connected.

In addition, as shown in step S110, the write potential $V_{pgm}$ is applied to the word line WL. Additionally, as shown in step S111, the threshold value of the cell MC is verified. If the threshold values of all the cells MC have reached the set threshold value, the write operation is completed. If the threshold values have not reached the set threshold value, the program returns to step S103. In this way, the above-described operation is repeated until the threshold values of all the cells MC reach the set threshold value.

According to the embodiment, if the threshold value of the cell MC configuring the page is less than the low threshold value VXL or not less than the set threshold value XV while employing the QPW method also when the threshold value of the cell MC is changed to the highest set threshold value, the gate potential $V_{sgdL}$ lower than the gate potential $V_{sgd}$ can be applied to the gate of the select gate transistor S2. As a result, leakage from the channel of the cell MC can be reduced while narrowing a width of the distribution of the cell MC set to be the highest set threshold value. Consequently, the write pass potential $V_{pass}$ can be lowered, and erroneous write can be prevented.

In addition, as shown in step S103 of FIG. 8 in the above-described first embodiment, since an operation for verifying whether or not the set threshold value is the highest set threshold value, a processing time can be reduced, can be omitted.

According to the embodiments described above, a nonvolatile semiconductor memory device that can achieve high integration can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

Direction of the host or the memory controller HM can also switch from a mode of using both the gate potential $V_{sgd}$ and the gate potential $V_{sdgL}$ to a mode of using one of them.

What is claimed is:

1. A nonvolatile semiconductor memory device comprising:
    a first bit line;
    a second bit line;
    a third bit line;
    a first unit including first memory cells connected in series and a first select gate transistor, one end of the first select gate transistor being connected to the first bit line;
    a second unit including second memory cells connected in series and a second select gate transistor, one end of the second select gate transistor being connected to the second bit line;
    a third unit including third memory cells connected in series and a third select gate transistor, one end of the third select gate transistor being connected to the third bit line;
    a plurality of word lines connected to gates of the first to third memory cells;
    a select gate line connected to gates of the first to third select gate transistors; and
    a controller configured to perform a first writing operation in a first period and a second writing operation in a second period different from the first period,
    the controller being configured to apply a first voltage to a select gate line when the controller is configured to apply a second voltage to the first bit line, to apply a third voltage to the second bit line, and to apply a program voltage to a selected word line in the first writing operation, the second voltage being higher than the third voltage, and
    the controller being configured to apply a fourth voltage to the select gate line when the controller is configured to apply the second voltage to the first bit line, to apply the third voltage to the second bit line, to apply a fifth voltage to the third bit line, and to apply the program voltage to the selected word line in the second writing operation, the fifth voltage being higher than the third voltage and being lower than the second voltage, and the fourth voltage being different from the first voltage.

2. The device according to claim 1, wherein, when the controller performs the second writing operation, the controller is configured to apply a sixth voltage to the select gate line in a first period and to apply a fourth voltage to the select gate line in a second period after the first period.

3. The device according to claim 1, wherein the fourth voltage is lower than the first voltage.

4. The device according to claim 3, wherein the fourth voltage is a power supply voltage of the nonvolatile semiconductor memory device.

5. The device according to claim 1, wherein when data allocated to the highest threshold value is written, the controller is configured to perform the first writing operation.

6. The device according to claim 5, wherein when data except for data allocated to the highest threshold value or data allocated to the lowest threshold value is written, the controller is configured to perform the second writing operation.

7. The device according to claim 1, wherein, when the controller performs the first writing operation, the controller is configured to apply a sixth voltage to the select gate line in a first period and to apply the first voltage to the select gate line in a second period after the first period.

8. The device according to claim 1, wherein a voltage lower than the program voltage is applied to the selected word line before the program voltage is applied to the selected word line.

9. A nonvolatile semiconductor memory device comprising:
    a first bit line;
    a second bit line;
    a third bit line;
    a first unit including first memory cells connected in series and a first select gate transistor, one end of the first select gate transistor being connected to the first bit line;
    a second unit including second memory cells connected in series and a second select gate transistor, one end of the second select gate transistor being connected to the second bit line;
    a third unit including third memory cells connected in series and a third select gate transistor, one end of the third select gate transistor being connected to the third bit line;
    a plurality of word lines connected to gates of the first to third memory cells;
    a select gate line connected to gates of the first to third select gate transistors; and
    a controller configured to perform a first writing operation and a second writing operation,
    the controller being configured to perform the first writing operation when at least one of the second memory cells is in a first state just before writing to change a threshold voltage of the at least one of the second memory cells,
    the controller being configured to perform the second writing operation when the second memory cells is in a second state not just before the writing,
    the controller being configured to apply a first voltage to a select gate line when the controller is configured to apply a second voltage to the first bit line, to apply a third voltage to the second bit line, and to apply a program voltage to a select word line in the first writing operation, the second voltage being higher than the third voltage, and
    the controller being configured to apply a fourth voltage to the select gate line when the controller is configured to apply the second voltage to the first bit line, to apply the third voltage to the second bit line, to apply a fifth voltage to the third bit line, and to apply the program voltage to the selected word line in the second writing operation, the fifth voltage being higher than the third voltage and being lower than the second voltage, the fourth voltage being different from the first voltage.

10. The device according to claim 9, wherein, when the controller performs the second writing operation, the controller is configured to apply a sixth voltage to the select gate line in a first period and to apply a fourth voltage to the select gate line in a second period after the first period.

11. The device according to claim 9, wherein the fourth voltage is lower than the first voltage.

12. The device according to claim 1, wherein the fourth voltage is a power supply voltage of the nonvolatile semiconductor memory device.

13. The device according to claim 9, wherein when data allocated to the highest threshold value is written, the controller is configured to perform the first writing operation.

14. The device according to claim 13, wherein when data except for data allocated to the highest threshold value or data allocated to the lowest threshold value is written, the controller is configured to perform the second writing operation.

15. The device according to claim 9, wherein, when the controller performs the first writing operation, the controller is configured to apply a sixth voltage to the select gate line in a first period and to apply the first voltage to the select gate line in a second period after the first period.

16. The device according to claim 9, wherein a voltage lower than the program voltage is applied to the selected word line before the program voltage is applied to the selected word line.

17. A nonvolatile semiconductor memory device comprising:
- a first bit line;
- a second bit line;
- a third bit line;
- a first unit including first memory cells connected in series and a first select gate transistor, one end of the first select gate transistor being connected to the first bit line, the first memory cells having a plurality thresholds including a first value and another value, the first value being higher than the other value and highest among the thresholds;
- a second unit including second memory cells connected in series and a second select gate transistor, one end of the second select gate transistor being connected to the second bit line;
- a third unit including third memory cells connected in series and a third select gate transistor, one end of the third select gate transistor being connected to the third bit line;
- a plurality of word lines connected to gates of the first to third memory cells;
- a select gate line connected to gates of the first to third select gate transistors; and
- a controller configured to perform a first writing operation to set the first value and a second writing operation to set the other value,
- the controller being configured to apply a first voltage to a select gate line when the controller is configured to apply a second voltage to the first bit line, to apply a third voltage to the second bit line, and to apply a program voltage to a selected word line in the first writing operation, the second voltage being higher than the third voltage, and
- the controller being configured to apply a fourth voltage to the select gate line when the controller is configured to apply the second voltage to the first bit line, to apply the third voltage to the second bit line, to apply a fifth voltage to the third bit line, and to apply the program voltage to the selected word line in the second writing operation, the fifth voltage being higher than the third voltage and being lower than the second voltage, the fourth voltage being different from the first voltage.

18. The device according to claim 17, wherein, when the controller performs the second writing operation, the controller is configured to apply a sixth voltage to the select gate line in a first period and to apply a fourth voltage to the select gate line in a second period after the first period.

19. The device according to claim 17, wherein the fourth voltage is lower than the first voltage.

20. The device according to claim 19, wherein the fourth voltage is a power supply voltage of the nonvolatile semiconductor memory device.

21. The device according to claim 17, wherein when data allocated to the highest threshold value is written, the controller is configured to perform the first writing operation.

22. The device according to claim 21, wherein when data except for data allocated to the highest threshold value or data allocated to the lowest threshold value is written, the controller is configured to perform the second writing operation.

23. The device according to claim 17, wherein, when the controller performs the first writing operation, the controller is configured to apply a sixth voltage to the select gate line in a first period and to apply the first voltage to the select gate line in a second period after the first period.

24. The device according to claim 17, wherein a voltage lower than the program voltage is applied to the selected word line before the program voltage is applied to the selected word line.

* * * * *